United States Patent [19]
Kawakami

[11] Patent Number: 5,877,091
[45] Date of Patent: Mar. 2, 1999

[54] MULTILAYER ROUTING METHOD AND STRUCTURE FOR SEMICONDUCTOR INTEGRATED CIRCUIT

[75] Inventor: Yoshiyuki Kawakami, Osaka, Japan

[73] Assignee: Matsushita Electric Industrial Co. Ltd,, Osaka, Japan

[21] Appl. No.: 648,500

[22] Filed: May 15, 1996

[30] Foreign Application Priority Data

May 19, 1995 [JP] Japan .................................. 7-120965

[51] Int. Cl.⁶ .................................................. H01L 21/00
[52] U.S. Cl. ......................... 438/737; 216/18; 257/758; 257/774; 257/781; 438/637; 438/738
[58] Field of Search .................................. 216/2, 18, 38, 216/39; 438/618, 620, 637, 737, 738; 257/758, 774, 775, 781

[56] References Cited

FOREIGN PATENT DOCUMENTS 6-301747  10/1994  Japan .

OTHER PUBLICATIONS

IEEE Transactions On Computer–Aided Design, "Minimum–Via Topological Routing", Chi–Ping Hsu, vol. Cad–2, No. 4, pp. 235–246 (Oct. 1983).

IEEE Transactions On Computer–Aided Design, "Unconstrained Via Minimization for Topological Multilayer Routing", M. Stallmann et al., vol. 9, No. 9, pp. 970–980 (Sep. 1990).

*Primary Examiner*—William Powell
*Attorney, Agent, or Firm*—McDermott, Will & Emery

[57] ABSTRACT

A constraint graph is generated by representing plural nets by using vertices and correlation in the horizontal and vertical directions among the nets by using edges. Then, clustering is conducted so that each of the vertices of the constraint graph is assigned to any one of plural layers in view of a channel height and so as to minimize the number of stacked vias. Next, routing topology is obtained on the basis of obtained clusters of the respective layers and the constraint graph, and routing patterns satisfying a design rule are obtained on the basis of the routing topology. In the clustering, the number of the stacked vias is minimized while retaining the minimum channel height in view of the final routing patterns. Accordingly, the routing patterns satisfying a desired design rule can realize a high density, resulting in a compact semiconductor integrated circuit.

10 Claims, 22 Drawing Sheets

GRAPH G (a)

GRAPH G'

(b)

GRAPH G

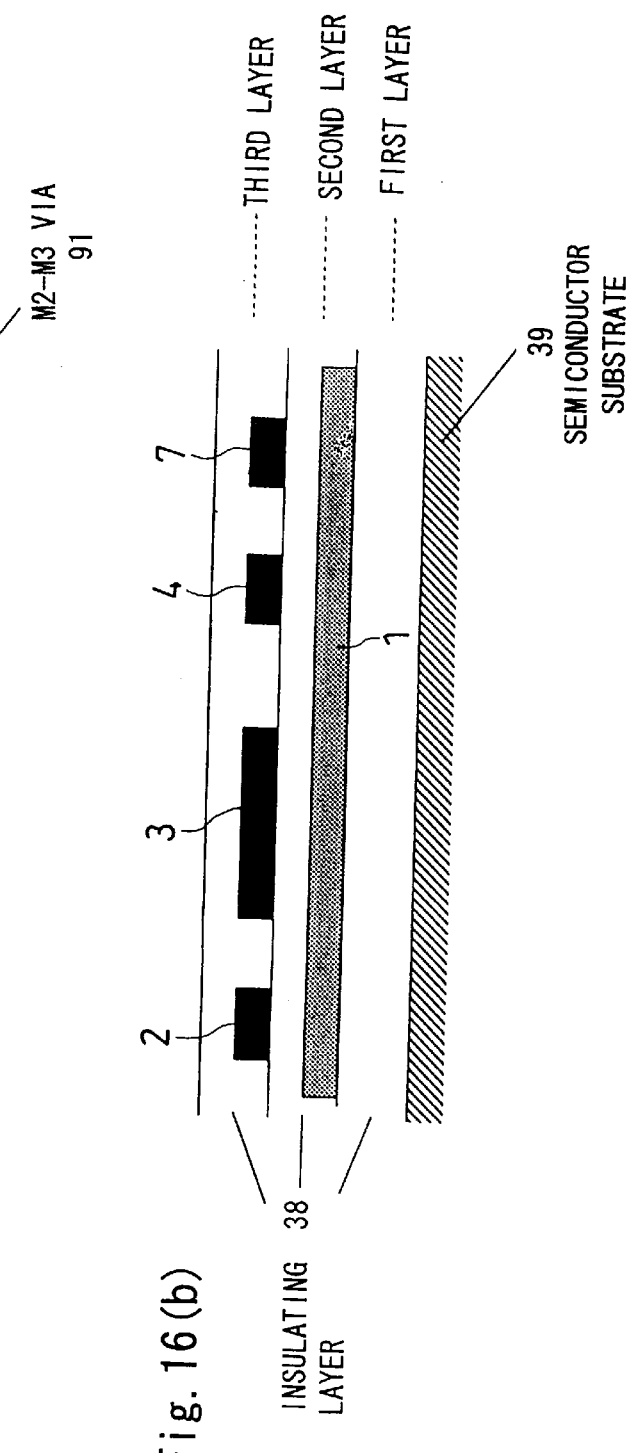

MULTILAYER ROUTING METHOD AND STRUCTURE FOR SEMICONDUCTOR INTEGRATED CIRCUIT

BACKGROUND OF THE INVENTION

The present invention relates to improvement of multilayer routing method and structure for a semiconductor integrated circuit.

Recently, the development of the technique in the field of semiconductor integrated circuits can provide a semiconductor integrated circuit including several million transistors mounted on merely one chip. For the purpose of decrease of the production cost of a semiconductor integrated circuit, it is necessary to further minimize the size of a semiconductor LSI chip, namely, to lay out at a high density a plurality of unit circuits (i.e., functional blocks or cells) and wires for logically interconnecting the unit circuits with-one another. From this point of view, the layout design for a semiconductor integrated circuit plays a significant role.

In the conventional layout, two-layer metal (aluminum) routing was regarded as a leading technique, but the recent technical development can now attain multilayer routing using three or more layers. An example of techniques for supporting the multilayer routing includes CMP (chemical metal polishing) method. The CMP method is a technique to flatten layers by polishing. Owing to this method, a plurality of layers can be uniformly stacked up without degrading the characteristics of a semiconductor integrated circuit.

Furthermore, the CMP method has largely changed the structure of a via (which is also designated as a contact). A via herein means an interconnection for connecting a wire disposed on a predetermined layer with another wire disposed on another layer at the same potential when an arbitrary net (signal line), extends from the former layer to the latter layer at the different level.

FIG. 21 is a sectional view of an area where a via is formed. Conventionally, a via could connect merely the adjacent layers at the same potential. For example, an M1–M2 via 35 of FIG. 21 is a conventional via for connecting a first layer wire 31 with a second layer wire 32. Such a conventional via retains the wires at the same potential by allowing aluminum patterns of these wires to be directly in contact with each other. When the wire on the first layer is to be connected with a wire on the fourth layer at the same potential by utilizing such a conventional via, three vias, that is, the M1–M2 via 35 for connecting the first layer wire 31 and the second layer wire 32, an M2–M3 via 36 for connecting the second layer wire 32 and a third layer wire 33 and an M3–M4 via 37 for connecting the third layer wire 33 and a fourth layer wire 34, are disposed so as not to be stacked along one vertical line as is shown in FIG. 21. Accordingly, the connection between the first layer wire and the fourth layer wire at the same potential requires an area equal to the sizes of at least two vias.

As an improvement of this conventional via, a stacked via formed by the CMP method so as to be stacked along a vertical line (hereinafter referred to as the stacked via) as is shown in FIG. 22 has been proposed. In this stacked via, the wires to be connected, i.e., the first layer wire 31, the second layer wire 32, the third layer wire 33 and the fourth layer wire 34, are vertically stacked as shown in FIG. 22 with respectively providing plugs 40 between the first layer wire 31 and the second layer wire 32, between the second layer wire 32 and the third layer wire 33 and between the third layer wire 33 and the fourth layer wire 34. Thus, the first layer wire 31 is connected with the fourth layer wire 34.

When this structure is adopted, the wires on arbitrary two layers can be connected by using an area equal to the size of one via. In FIG. 22, a reference numeral 38 denotes insulating layers included in the respective layers and a reference numeral 39 denotes a semiconductor substrate.

On the other hand, with regard to the routing technique, various methods have been proposed. Many of the conventionally proposed techniques are for the formation of the two-layer interconnection. However, the recent development of the LSI production technique can now realize a multilayer layout, and hence, a large number of proposes have recently been made on the multilayer interconnection.

Among these proposes, routing methods using via minimization technique are conspicuous. Examples of such methods include a Hsu method for the two-layer interconnection ("Minimum-Via Topological Routing", IEEE Trans. Computer-Aided Design, vol. CAD-2, pp. 235–246, 1983) and a Stallmann method for the multilayer interconnection using three or more layers ("Unconstrained Via Minimization for Topological Multilayer Routing", IEEE Trans, Computer-Aided Design, pp. 970–980, 1990). According to these routing methods, a routing pattern including a minimized number of vias can be generated. These routing methods are attained by perceiving that, when the number of vias is smaller, a routing pattern having a smaller routing area tends to be generated with ease. These methods further have a secondary effect to increase the yield in the production of semiconductor chips because of the decreased number of vias.

However, in these conventional routing methods utilizing the via minimization technique, an attention is paid to the minimization of the stacked vias alone. Therefore, for example, since the number of the stacked vias is decreased, the resultant routing pattern is bent, resulting in a disadvantage that the routing area can be accordingly enlarged. Furthermore, in the conventional routing methods utilizing the via minimization technique, routing topology including a minimized number of vias is generated on the assumption that the sizes of a line width and a via are "0". After this, an art work process is conducted for fleshing out the routing pattern and the vias (actual route patterning), so as to complete the routing. Accordingly, even though each wire or the like has actually its own size, the final routing area is ignored in the step of obtaining the routing topology. As a result, when the art work process is conducted, the wire density of the actual routing pattern is unexpectantly low, and the routing area is disadvantageously enlarged.

SUMMARY OF THE INVENTION

An object of the invention is providing a multilayer routing method for a semiconductor integrated circuit in which the number of stacked vias can be minimized while also minimizing a routing area, and providing a multilayer routing structure obtained by this method.

In order to attain the above-described object, in the routing method of this invention, each net (i.e., signal lines to be connected in accordance with logical connection requirement) is assigned to one of multiple layers in consideration of the number of vias and the size of the routing area.

Specifically, in the multilayer routing method for a semiconductor integrated circuit of this invention, plural functional blocks or cells each having at least one terminal are allocated and the allocated functional blocks or cells are interconnected with one another at the terminals by using a predetermined number of layers in accordance with logical connection requirements. This method comprises a channel generation step of defining a channel for routing plural nets for interconnecting the terminals with one another; a constraint graph generation step of generating a constraint graph by representing constraint in horizontal and vertical directions among the plural nets in the defined channel by using edges and also representing the plural nets by using vertices; a clustering step of obtaining clusters with regard to the respective layers by assigning the vertices of the constraint graph to the predetermined number of layers so as to minimize a number of vias in consideration of a height of the defined channel; a topology generation step of generating routing topology on the basis of the clusters of the respective layers and the constraint graph; and a channel compaction step of generating routing patterns satisfying a design rule on the basis of the routing topology.

In one aspect of the present method, in the constraint graph generation step, the constraint in the horizontal direction among the plural nets is represented by using an undirected edge and the constraint in the vertical direction among the plural nets is represented by using a directed edge, and when both the undirected edge and the directed edge are present between arbitrary two nets, the undirected edge is eliminated, so as to generate a constraint graph consisting of a remaining undirected edge, a directed edge and vertices.

In another aspect of the present method, the clustering step includes an initial clustering step of initially assigning the plural nets to the predetermined number of layers on the basis of the constraint graph; a cut value evaluation step of calculating a cut value which is a number of edges of the constraint graph between adjacent clusters among clusters obtained with regard to the respective layers in the initial clustering step; an intra-cluster edge number evaluation step of calculating a number of the edges of the constraint graph in each of the clusters of the respective layers obtained in the initial clustering step; a channel height evaluation step of calculating a needed channel height in each of the clusters of the respective layers obtained in the initial clustering step on the basis of the number of the edges of the constraint graph obtained in the intra-cluster edge number evaluation step; and an inter-cluster net moving/exchanging step of moving and/or exchanging the nets among the clusters of the respectively layers obtained in the initial clustering step on the basis of the cut value, the number of the edges of the constraint graph in each of the clusters and the channel height obtained in the three evaluation steps, so as to minimize the cut value, the number of the edges in each of the clusters and the channel height.

Accordingly, each of the vertices of the constraint graph is assigned to one of the layers so as to minimize the number of the vias in the clustering step of this invention, and thus clusters are generated with regard to the respective layers. Therefore, the channel height can be evaluated with regard to each cluster (namely, each layer), and hence, by appropriately adjusting the assignment of the vertices of the constraint graph to the layers so as to decrease the channel height of each layer, the number of the stacked vias in each cluster can be minimized while suppressing the channel height of each layer. Since the channel height of each layer can be thus suppressed, the routing can be completed while retaining each channel with a small area (namely, the routing can attain a high density). As a result, a further compact semiconductor integrated circuit can be attained. In addition, the channel height can be evaluated through a simple operation of assigning each vertex to one of the layers, and hence, the processing speed can be increased.

The above and other objects, features and advantages of the present invention will be apparent from the following detailed description in conjunction with the accompanying drawings.

BRIEF DESCRIPTION OF THE DRAWINGS

Preferred embodiments of the present invention are illustrated in the accompanying drawings in which:

FIG. 16(a) is a diagram for showing the final routing result by the multilayer routing method, and FIG. 16(b) is a sectional view of a main part of the final routing result by the multilayer routing method;

DETAILED DESCRIPTION OF THE INVENTION

The present invention will now be described referring to the accompanying drawings illustrating the preferred embodiments thereof.

(Embodiment 1)

Figure 1:
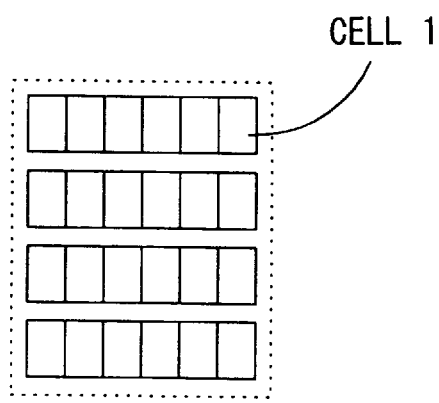
FIG. 1 is a schematic diagram for showing the entire configuration of a semiconductor integrated circuit of a first embodiment of the invention.

FIG. 1 shows a multilayer routing structure for a semiconductor integrated circuit according to a first embodiment of the invention, wherein an LSI block of a standard cell type is exemplified. In this layout, unit circuits each having basic logic such as cells and functional blocks are aligned in the form of an array, and the unit circuits are interconnected with one another in accordance with logical connection information. A portion surrounded by an ellipse in FIG. 1 indicates a part of a channel (i.e., routing area), which is shown in an enlarged view of FIG. 2.

Figure 2:
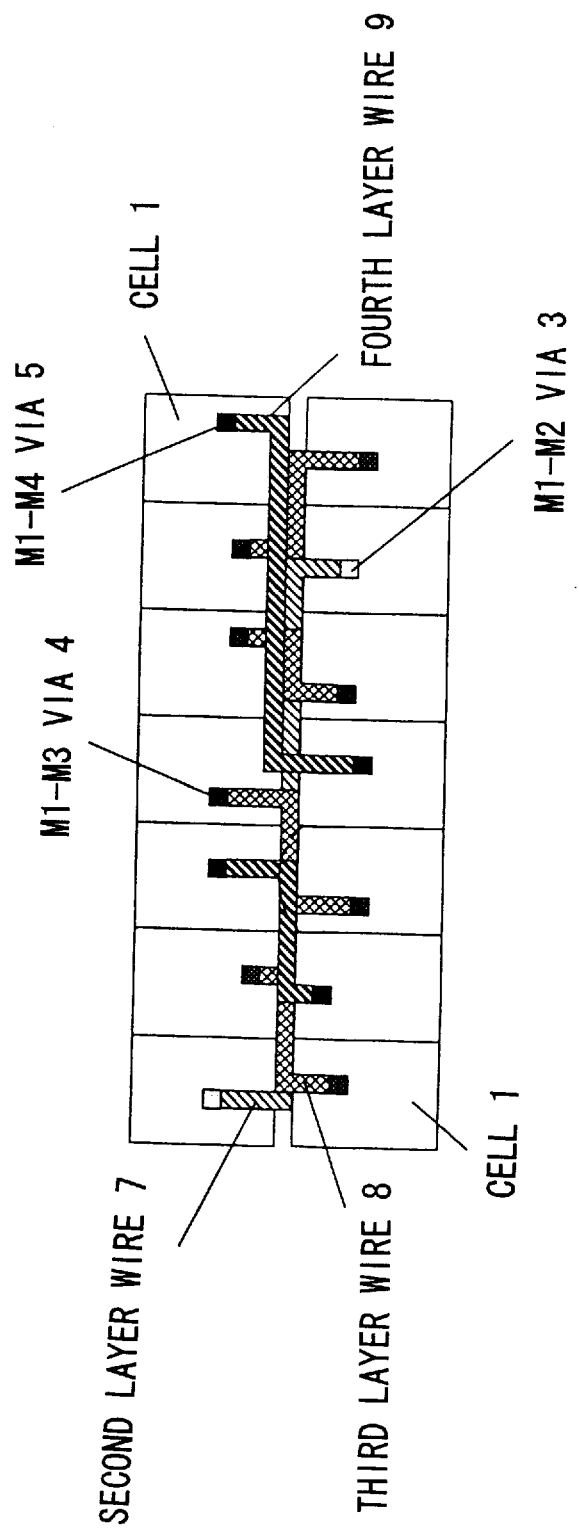
FIG. 2 is an enlarged view of a main part of the semiconductor integrated circuit of FIG. 1.
Figure 3A:
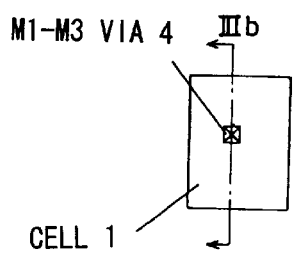
FIG. 3(a) is a diagram for showing an allocation of a stacked via in the semiconductor integrated circuit of FIG. 1.

As is shown in FIG. 2, a plurality of cells or functional blocks (hereinafter referred to as the cells) 1 are aligned in the form of an array, and between the cells are disposed wires on respective layers such as a second layer wire 7 and a third layer wire 8. As wires for connecting internal elements in each cell 1, wires on the lowermost first layer are used. Furthermore, as is shown in FIGS. 3(a) and 3(c), a terminal 2 of each cell 1, that is, a connecting point for the logical connection among the respective cells 1, is provided to each cell 1, so as to be connected with a wire located on an arbitrary one of the layers. FIG. 2 exemplifies the case where the cells 1 are logically connected with one another by using one predetermined layer in each net. A net herein means signal lines to be connected with each other at the same potential. In addition, a wire extending in the horizontal direction is designated as a trunk, and a wire extending in the vertical direction is designated as a subline.

Each terminal 2 is present in the lowermost first layer, and hence, a via is required to connect the terminal 2 with a wire present in any of the other layers. In this embodiment, the via is formed as a stacked via, and the stacked via is disposed directly above the terminal 2 of each cell 1, so that the terminal 2 is connected with a wire on a desired layer through the stacked via. For example, in FIG. 2, an M1–M2 via 3, an M1–M3 via 4 and an M1–M4 via 5 are stacked vias. In this case, an M1–M3 via indicates a stacked via for connecting the wire on the first layer with a wire 8 on the third layer. In FIG. 2, a reference numeral 7 denotes a wire disposed on the second layer and a reference numeral 9 denotes a wire disposed on the fourth layer.

Each of the stacked vias 3, 4 and 5 is disposed in the same position as or in an adjacent position to the terminal 2 of each cell 1. For example, in FIGS. 3(a) and 3(b), the M1–M3 via 4 is disposed in the same position as the terminal 2 of the cell 1, and in FIGS. 3(c) and 3(d), the M1–M4 via 5 is disposed in the adjacent position to the terminal 2 of the cell 1. In FIGS. 3(c) and 3(d), the M1–M4 via 5 and the terminal 2 of the cell 1 are connected through a wire 6 on the first layer.

Figure 3B:
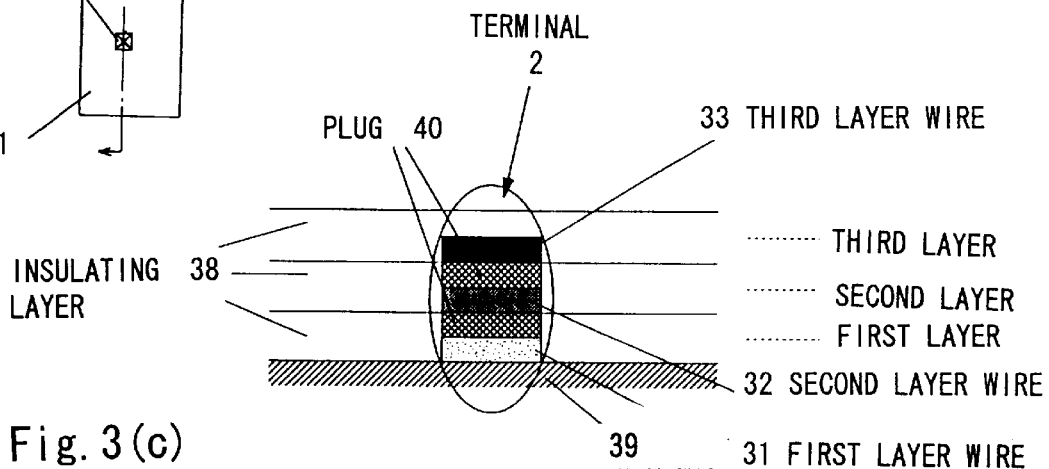
FIG. 3(b) is a sectional view of the stacked via of FIG. 3(a)
Figure 3C:
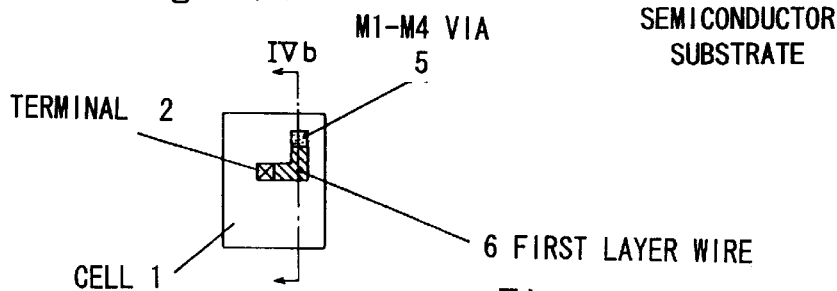
FIG. 3(c) is a diagram for showing another allocation of the stacked via.
Figure 3D:
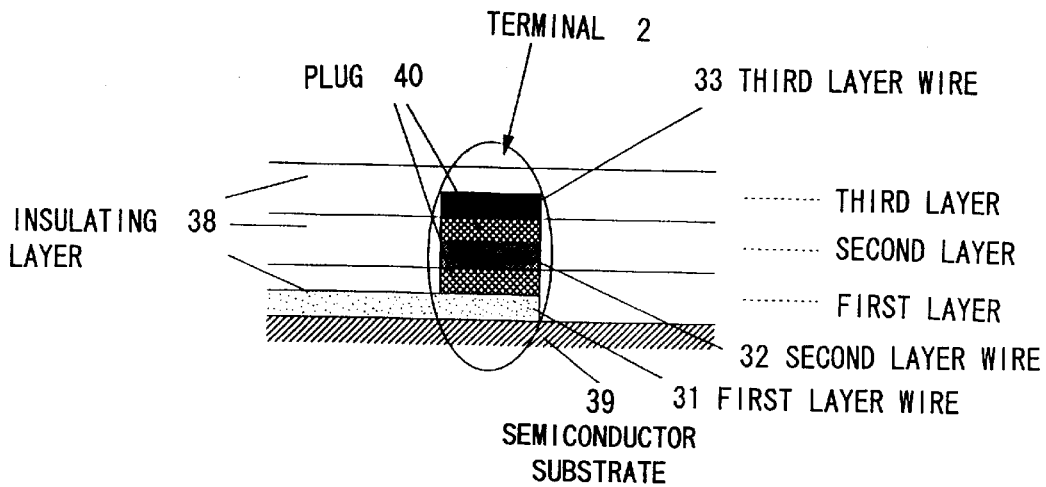
FIG. 3(d) is a sectional view of the stacked via of FIG. 3(c)
Figure 22:
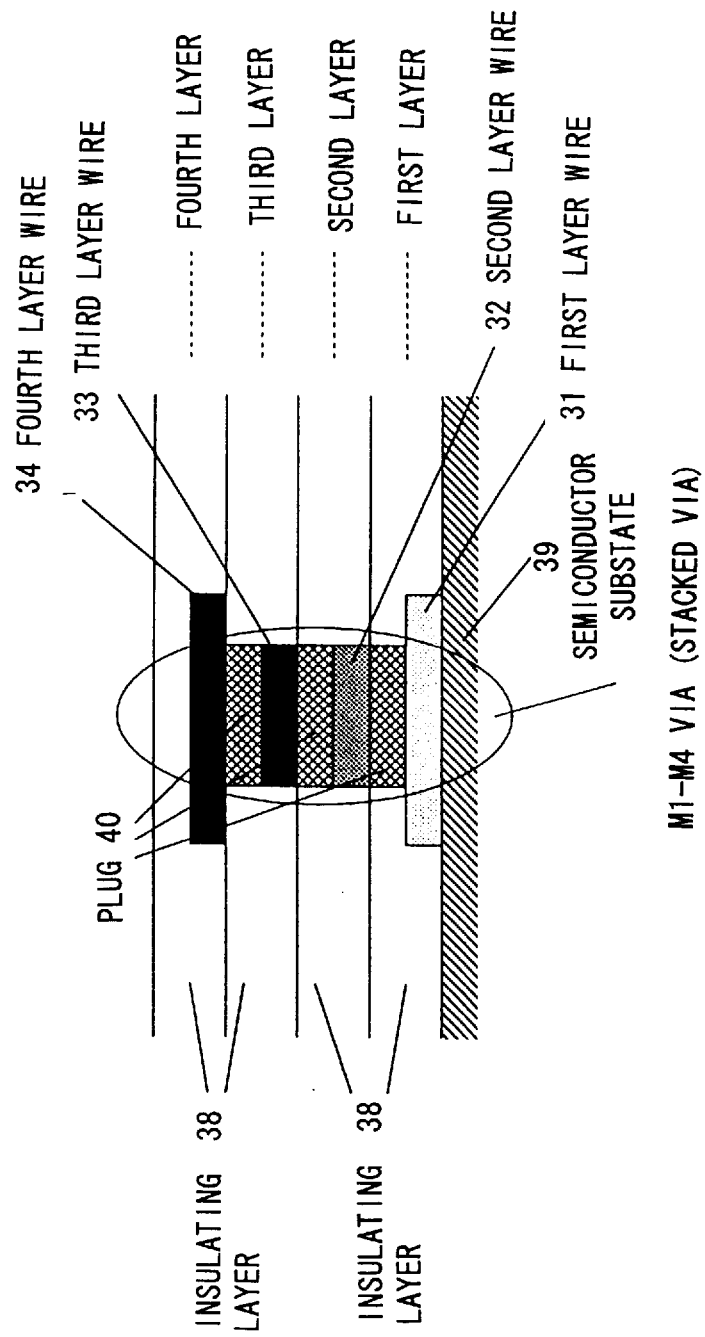
FIG. 22 is a sectional view for showing the structure of a stacked via.

In FIGS. 3(b) and 3(d), a reference numeral 31 denotes the first layer wire, a reference numeral 32 denotes the second layer wire, a reference numeral 33 denotes the third layer wire, a reference numeral 38 denotes an insulating layer included in each of the layers, and a reference numeral 40 denotes plugs, all of which are similar to those described as the conventional structure referring to FIG. 22.

In this embodiment, since the stacked vias 3, 4 and 5 are disposed in the same position as or in the adjacent position to the terminals 2, there is no need to dispose routing patterns constructing the respective nets in detoured routes around the stacked vias. Therefore, the routing patterns can be disposed at a high density, resulting in decreasing a routing area.

The description is herein made with regard to a semiconductor. LSI of the standard cell type, but this embodiment is also applicable to a multilayer routing structure of a semiconductor LSI of other types such as a gate array type (a sea-of-gate type) and an embedded cell array type.

(Embodiment 2)

A multilayer routing method for a semiconductor integrated circuit according to a second embodiment of the invention will now be described referring to FIGS. 4 through 14.

Figure 4:
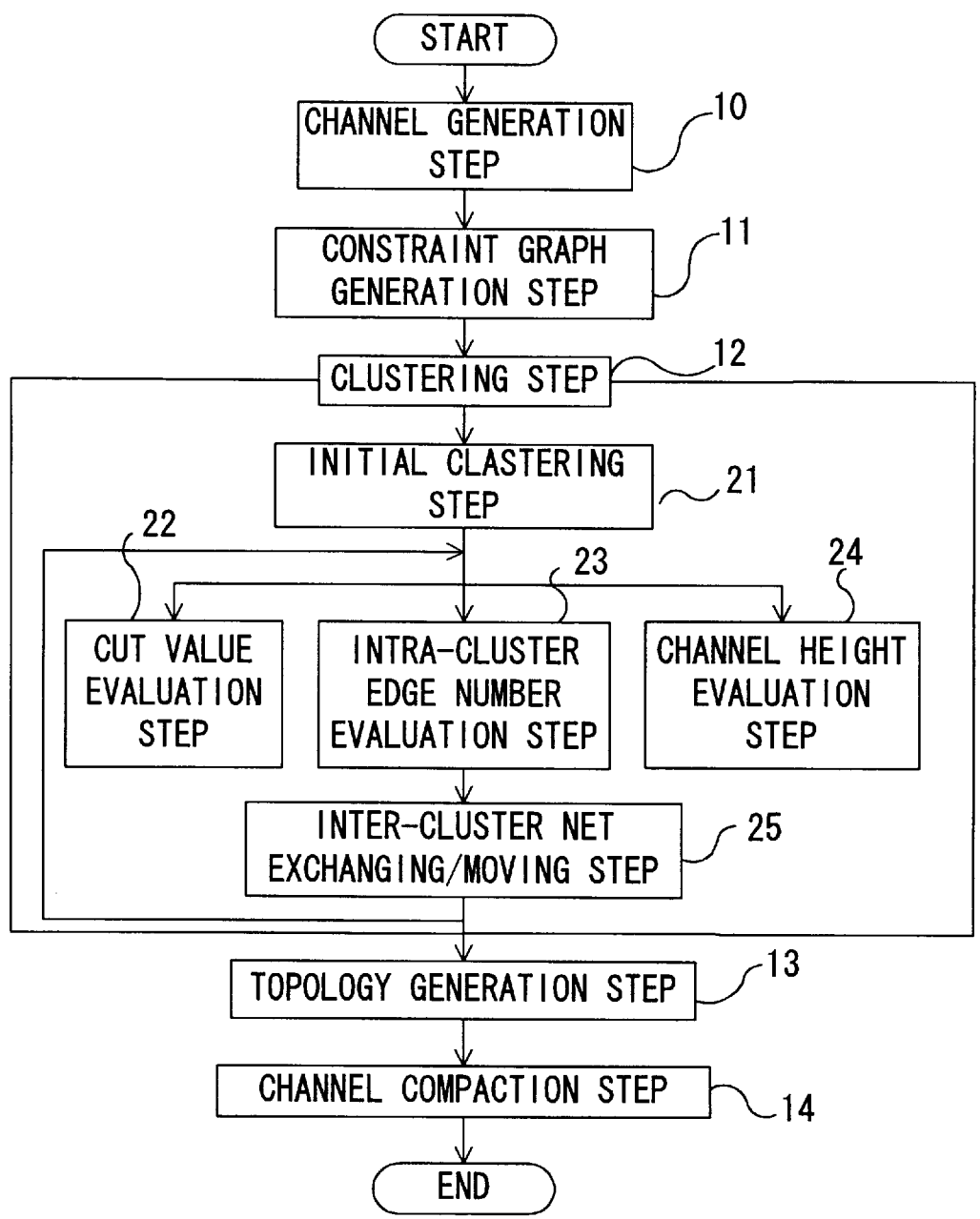
FIG. 4 is a flow chart showing a multilayer routing method for a semiconductor integrated circuit of a second embodiment of the invention.

FIG. 4 is a flow chart for this multilayer routing method. In FIG. 4, a reference numeral 10 denotes a channel generation step, a reference numeral 11 denotes a constraint graph generation step, a reference numeral 12 denotes a clustering step, a reference numeral 13 denotes a topology eneration step, and a reference numeral 14 denotes a channel compaction step. The clustering step 12 includes an initial clustering step 21, a cut value evaluation step 22, an intra-cluster edge number evaluation step 23, a channel height evaluation step 24 and an inter-cluster net exchanging/moving step 25.

Figure 5A:
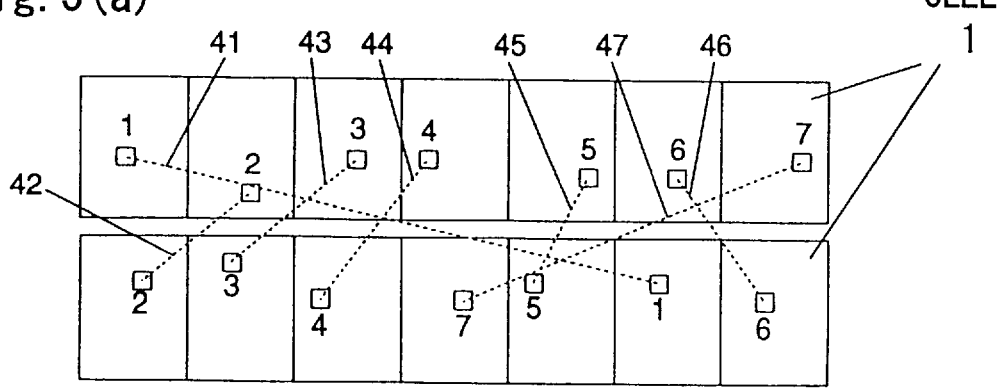
FIG. 5(a) is a diagram for showing routing requirements in the multilayer routing method.
Figure 5B:
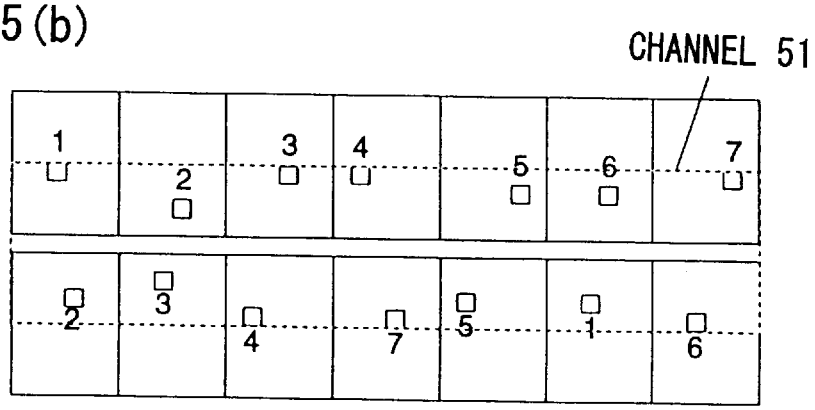
FIG. 5(b) is a diagram for showing the detail of a channel generation step in the multilayer routing method.

Now, the respective steps will be described in detail. FIG. 5(a) shows an example of a part of cell arrays included in a semiconductor LSI block of the standard cell type and the routing area among the cell arrays. In FIG. 5(a), each cell 1 is provided with a terminal thereon. In the following description, each net is assumed to connect two of the terminals with each other. Reference numerals 41, 42, 43, 44, 45, 46 and 47 denote nets 1, 2, 3, 4, 5, 6 and 7, respectively. Connection requirements for the nets are shown with dot lines. In FIG. 5(a), the two terminals to be connected through the corresponding net are referred to by using the reference numeral of the net. First, in the channel generation step 10, a channel is defined. A channel is a minimum rectangular area surrounding a group of terminals included in the two adjacent cell arrays. In the case shown in FIG. 5(a), an area 51 surrounded with a dot line in FIG. 5(b) is defined as a channel.

Next, in the constraint graph generation step 11, the intersecting relationship, in the horizontal and vertical directions, among the plural nets 1 through 7 within the defined channel is represented by a graph.

Figure 5C:
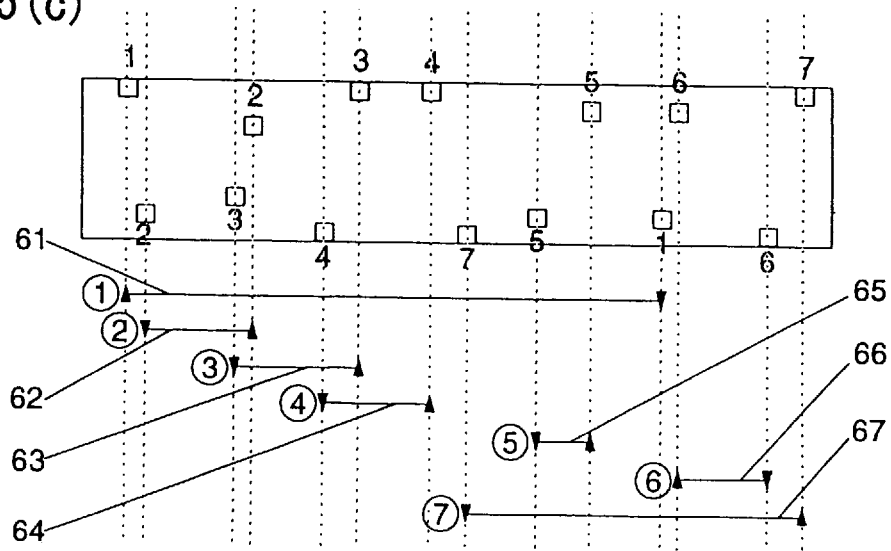
FIG. 5(c) is a diagram showing segment representation of each net in the multilayer routing method.

Specifically, in the constraint graph generation step 11, each net is first represented by a segment. FIG. 5(c) is a diagram showing the segment representation of the nets 1 through 7 of FIG. 5(a). Each segment is defined as a minimum segment including the terminals belonging to the corresponding net. In the case shown in FIG. 5(a), for example, the net 41 is represented by a segment 61 and the net 42 is represented by a segment 62. Similarly, the nets 43 through 47 are represented by segments 63 through 67, respectively. In FIG. 5(c), upward and downward arrows at the ends of each segment indicate the routing directions at these ends. For example, with regard to the segment 61, a terminal is present in the upper direction of the channel at its left end, and another terminal is present in the lower direction of the channel at its right end.

Figure 6A:
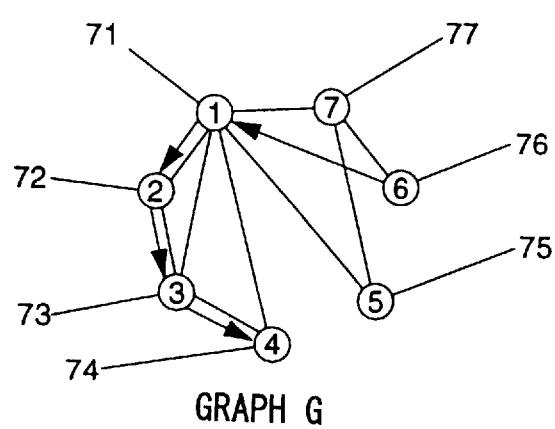
FIG. 6(a) is a diagram for showing a constraint graph in the multilayer routing method.

Then, based on the segment representation of the nets shown in FIG. 5(c), a constraint graph is generated as follows: In FIG. 6(a), each vertex indicates each net, and an edge indicates an overlap in the horizontal or vertical direction between one segment and another segment. First, the overlap in the horizontal direction will be examined. For example, the segment 61 representing the net 1 has an overlap in the horizontal direction with the segment 62 representing the net 2. This means that, in the case where the net 1 and the net 2 are to be interconnected through the same layer, the nets 1 and 2 cannot be disposed on the same horizontal level. This is designated as horizontal constraint. In order to represent this constraint on the graph, an undirected edge is drawn between,the vertex 71 of the net 1 and the vertex 72 of the net 2. Similarly, there exist overlaps in the horizontal direction between the segments 61 and 63, the segments 61 and 64, the segments 61 and 65, the segments 61 and 67, the segments 62 and 63, the segments 63 and 64, the segments 65 and 67 and the segments 66 and 67, and hence, undirected edges are drawn between the vertices 71 and 73, the vertices 71 and 74, the vertices 71 and 75, the vertices 71 and 77, the vertices 72 and 73, the vertices 73 and 74, the vertices 75 and 77, and the vertices 76 and 77.

Next, the overlap in the vertical direction will be examined. For example, with regard to the relationship between the left end of the segment 61 representing the net 1 and the left end of the segment 62 representing the net 2, when the nets 1 and 2 are to be interconnected through the same layer, the net 1 is required to be disposed above the net 2, otherwise the nets 1 and 2 would be electrically short-circuited. Constraint derived from such terminal positions is indicated as the overlap in the vertical direction, which is designated as vertical constraint. In order to represent the vertical constraint in the graph, a directed edge is drawn from the vertex 71 of the net 1 to the vertex 72 of the net 2 in FIG. 6(a). Generally, each wire requires a predetermined width, and a predetermined spacing is also required between wires. Therefore, even in the case where two terminals are not on the same vertical line, the vertical constraint is caused when a spacing between the terminals is smaller than a predetermined distance. In this embodiment, the vertical constraint is caused between, for example, the segments 62 and 63 and the segments 66 and 61. Therefore, directed edges are drawn from the vertex 72 to the vertex 73 and from the vertex 76 to the vertex 71.

In the nets having the horizontal constraint, when a via can be eliminated by appropriately setting the vertical positional relationship between the trunks of the nets, the vertical positional relationship is represented by a directed edge. Such a relationship can be found between the segments 63 and 64 in FIG. 5(c), namely, between the vertex 73 and the vertex 74 in FIG. 6(a).

Figure 6B:
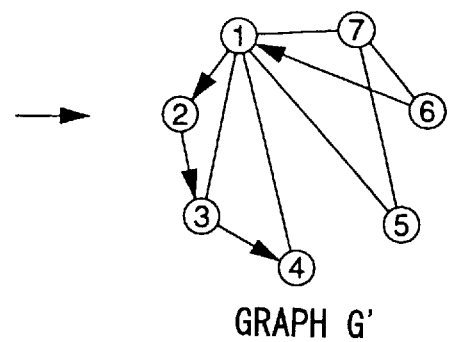
FIG. 6(b) is a diagram for showing a new constraint graph in the multilayer routing method.

A graph obtained through the aforementioned process is designated as a constraint graph G. Furthermore, when there exist both an undirected edge and a directed edge between two vertices in the constraint graph G, the undirected edge is eliminated so as to have the directed edge alone remained. Thus, a new constraint graph G' can be obtained as is shown in FIG. 6(b). This graph is designated as a horizontal vertical constraint graph. The horizontal vertical constraint graph G' reveals the following:

When it is assumed that each net is interconnected through only one layer,
(1) in the case where the nets having both an undirected edge and a directed edge are to be interconnected through the same layer, the trunks of the nets cannot be disposed on the same horizontal level;
(2) in the case where the nets having an undirected edge alone are to be interconnected through different layers, the trunks of the nets can be disposed on the same horizontal level without providing a via; and
(3) in the case where the nets having a directed edge alone are to be interconnected, the trunks of the nets can be disposed without providing a via by aligning the trunks in the same directions as those of the directed edges.

The items (2) and (3) are significant in view of the minimization of the number of vias. When two nets connected through an edge are assigned to different layers, this assignment can minimize the number of vias in the nets.

Figure 7:
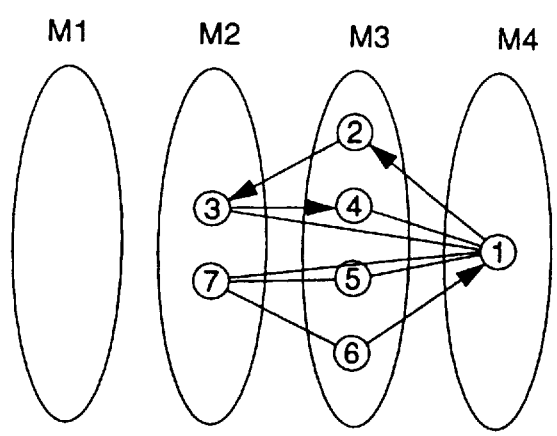
FIG. 7 is a diagram for showing the detail of an initial clustering step in the multilayer routing method.
Figure 8:
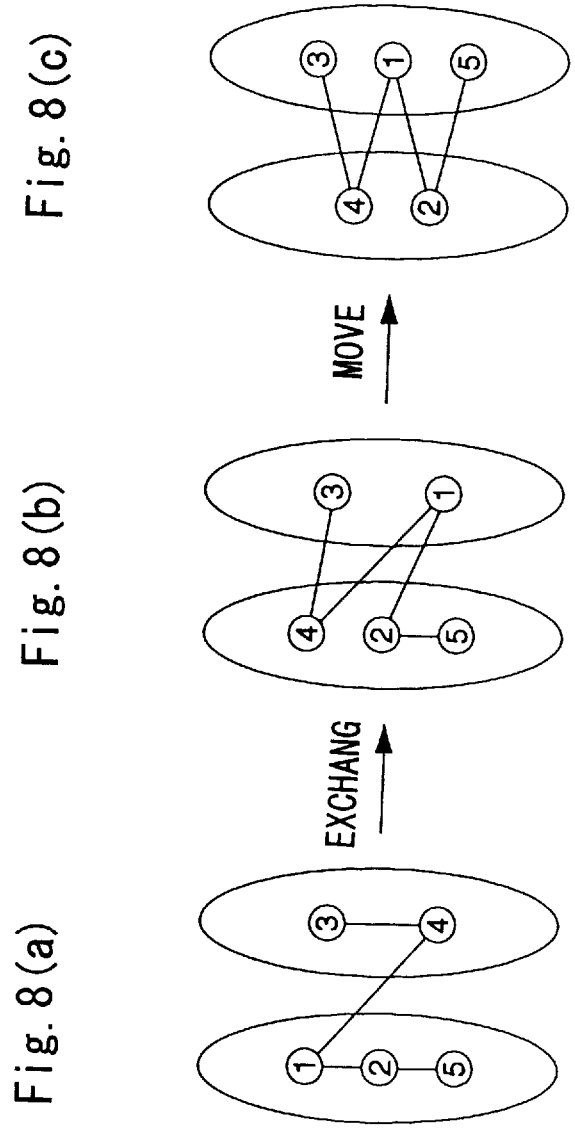
FIG. 8(a) is a diagram for showing clusters before exchanging and moving nets in an inter-cluster net exchanging/moving step in the multilayer routing method.
FIG. 8(b) is a diagram for showing the clusters of FIG. 8(a) after exchanging nets.
FIG. 8(c) is a diagram for showing the clusters of FIG. 8(a) after moving a net.

In the clustering step 12, the aforementioned net assignment is conducted. The procedures for the assignment will now be specifically described. In this embodiment, it is assumed that four layers are available for the assignment, and hence, the nets are partitioned into four groups. A process to partition the nets into groups is herein designated as clustering, and each of the assigned groups is designated as a cluster. In this embodiment, the nets are clustered into a cluster M1 (a group of wires on the first layer), a cluster M2 (a group of wires on the second layer), a cluster M3 (a group of wires on the third layer) and a cluster M4 (a group of wires on the fourth-layer) as is shown in FIG. 7, thereby obtaining four clusters with regard to the respective layers.

In the initial clustering step 21, an initial solution for the clustering is obtained in order to conduct optimal clustering. In this case, the four layers are available for the interconnection, and hence, the clustering is started successively from the cluster M4 of the fourth layer. Since there are requirements to assign two nets connected through an edge to different layers as described above, each vertex (net) is assigned to any of the clusters so that the number of the edges can be minimized in each cluster. Therefore, the initial clustering disk conducted also in view of such assignment. The procedures can be exemplified as follows:

<Algorithm for the initial clustering step 21>
(1) The following operations (2) through (5) are conducted on a cluster $C_i = \{c_1, c_2, \ldots, c_{n-1}, c_n\}$ (wherein i=1 to n).
(2) A vertex is arbitrarily selected, so that the selected vertex belongs to a set S.
(3) One vertex v, which has no edge commonly with vertices belonging to the set S, is selected, so that the selected vertex v belongs to the set S.
(4) The operation (3) is repeatedly conducted until none of such a vertex v remains.
(5) Then, the vertices belonging to the set S are assigned to the cluster $C_i$.

(6) Vertices which have not been assigned to the cluster $C_j$ are assigned to another arbitrary cluster $C_j$.

When this algorithm is applied to the constraint graph G' of FIG. 6(b), the following operations are conducted:

(1) An object cluster is set to be the cluster M4.

(2) One vertex (for example, the vertex 71) is arbitrarily selected, so that the selected vertex belongs to the set S. Accordingly, the set S={the vertex 71}.

(3) A vertex, which has no edge commonly with the member of the set S, is selected, so that the selected vertex belongs to the set S. In the constraint graph G' of FIG. 6(b), such a vertex does not exist, and hence, the set S remains to be {the vertex 71}.

(4) The vertex belonging to the set S is assigned to the cluster M4.

(5) Then, the object cluster is set to be the cluster M3.

(6) One vertex (for example, the vertex 72) is arbitrarily selected, so that the selected vertex belongs to the set S. Accordingly, the set S={the vertex 72}.

(7) A vertex, which has no edge commonly with the member of the set S, (for example, the vertex 74) is selected, so that the selected vertex belongs to the set S. Accordingly, the set S={the vertex 72, the vertex 74}.

(8) Again, a vertex, which has no edge commonly with the members of the set S, (for example, the vertex 75) is selected, so that the selected vertex belongs to the set S. Accordingly, the set S={the vertex 72, the vertex 74, the vertex 75}.

(9) Subsequently, a vertex, which has no edge commonly with the members of the set S, (for example, the vertex 76) is selected, so that the selected vertex belongs to the set S. Accordingly, the set S={the vertex 72, the vertex 74, the vertex 75, the vertex 76}.

(10) Furthermore, a vertex, which has no edge commonly with the members of the set S, is selected, so that the selected vertex belongs to the set S. However, the constraint graph G' of FIG. 6(b) does not have such a vertex any more. Accordingly, the set S={the vertex, 72, the vertex 74, the vertex 75, the vertex 76}.

(11) The vertices belonging to the set S are assigned to the cluster M3.

(12) The object cluster is set to be the cluster M2.

(13) A vertex (for example, the vertex 73) is arbitrarily selected, so that the selected vertex belongs to the set S. Accordingly, the set S={the vertex 73}.

(14) A vertex, which has no edge commonly with the member of the set S, (for example, the vertex 77) is selected, so that the selected vertex belongs to the set S. Accordingly, the set S={the vertex 73, the vertex 77}.

(15) Since all the vertices have been selected, the vertices belonging to the set S are assigned to the cluster M2.

(16) The routing area for the internal connection in each cell 1 is assigned to the cluster M1, and the cluster M1 is defined as $\{\phi\}$. Thus, the procedures are completed.

Through the aforementioned procedures, the clusters M1, M2, M3 and M4 with regard to the respective layers as shown in FIG. 7 are generated.

Next, on the basis of the result of the initial clustering, the three evaluation steps 22 through 24 are conducted.

First, in the cut value evaluation step 22, the number of edges between two adjacent initial clusters (specifically, the total number of undirected and directed edges between the adjacent two initial clusters; hereinafter referred to as the cut value) is calculated. In this embodiment, the cut value C (i, j) between two adjacent clusters i and j (wherein i and j indicate variables) is calculated on the basis of FIG. 7 as follows:

C (M1, M2)=0
C (M2, M3)=6
C (M3, M4)=6

Next, in the intra-cluster edge number evaluation step 23, the number of the edges (the total number of the undirected and directed edges) in each of the clusters M1 through M4 is calculated. In this embodiment, the number E (i) of the edges in the cluster i is calculated based on FIG. 7 as follows:

E (M1)=0
E (M2)=0
E (M3)=0
E (M4)=0

Figure 11:
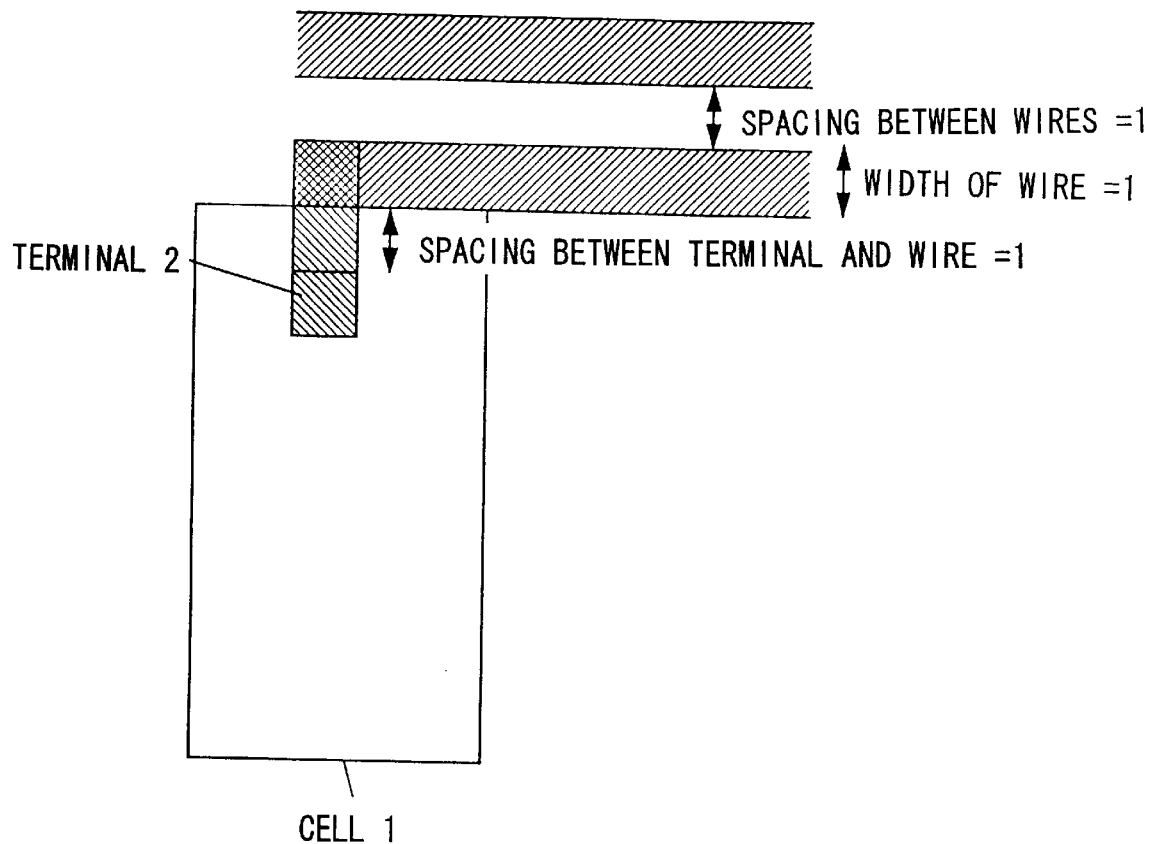
FIG. 11 is a diagram for showing the detail of a channel height evaluation step in the multilayer routing method.

Then, in the channel height evaluation step 24, the height of a channel is virtually calculated. In this case, since the respective clusters of the respective layers have different channel heights, the maximum channel height among the channel heights of the respective clusters is regarded as a channel height of the semiconductor integrated circuit. First, before calculating the channel height, the width of a wire and a spacing between the wires are defined as is shown in FIG. 11.

In each layer, the width of a wire, a spacing between two wires and a spacing between the terminal of a cell and a wire are uniformly defined to be one.

Next, the channel height H(M3) in the cluster M3 is obtained. There is no edge among the vertices of the cluster M3, and hence, there is no overlap among the nets. Accordingly, the height H(M3) can be obtained merely in view of the width of one wire and a spacing between the wire and a terminal connected at each end of the wire as follows:

H(M3)=1+1+1=3

Similarly, the channel height H(i) in each of the other clusters i is obtained as follows:

H(M1)=0
H(M2)=3
H(M4)=3

Therefore, the channel height needed is obtained as follows:

$$\begin{aligned}\text{The channel height} &= \text{Max}(H(M1), H(M2), H(M3), H(M4)) \\ &= \text{Max}(0, 3, 3, 3) \\ &= 3\end{aligned}$$

The aforementioned calculation of the channel height is conducted on the assumption that the terminals are disposed at the ends of the channel. However, in the case where there is a spacing between the terminal and the outer frame of the upper and lower sides of the channel, the channel height is calculated in consideration of this spacing.

Next, in the inter-cluster net exchanging/moving step 25, the clustering is optimized by exchanging or moving the vertices among the clusters in consideration of the results of the three evaluation steps 22 through 24. An example of this process is shown in FIGS. 8(a) through 8(c). Exchanging the vertices means, in FIGS. 8(a) and 8(b), an operation to exchange the vertex corresponding to a specific net (for example, one with the reference numeral 1) in a specific cluster with the vertex corresponding to another specific net (for example, one with the reference numeral 4). Moving the vertices means, in FIGS. 8(b) and 8(c), an operation to move the vertex corresponding to a specific net (for example, one with the reference numeral 5) in a specific cluster to another cluster.

An example of the process in the inter-cluster net exchanging/moving step 25 for exchanging/moving the vertices is described as follows:

<Algorithm for the inter-cluster net exchanging/moving step 25>

(1) A cluster i having the maximum channel height H(i) is selected.

(2) In the case where, the cut value C (i, j) between clusters i and j is decreased by exchanging a vertex v included in the cluster i with another arbitrary vertex w included in the cluster j, the vertices v and w are exchanged.

(3) The operation (2) is conducted with regard to all the vertices.

(4) In the case where, the total number of the edges in clusters i and j, that is, E(i)+E(j), is decreased by moving a vertex v included in the cluster i to the cluster j, the vertex v is moved to the cluster j.

(5) The operation (4) is conducted with regard to all the vertices.

In this embodiment, the channel height of the semiconductor circuit is "3" as described above, which is the minimum. Furthermore, the numbers of the edges in the respective clusters are E(M1)=E(M2)=E(M3)=E(M4)=0, which means there is no need to provide a stacked via in any layer (the number of vias=0). Accordingly, the vertices are neither exchanged nor moved, and the final clusters shown in FIG. 9 are identical to the initial clusters shown in FIG. 7.

The optimization of the clustering by the inter-cluster net exchanging moving step 25 is not limited to the aforementioned method. Other optimization methods such as a simulated annealing method ("Optimization by Simulated Annealing", Science, 220, pp. 671–680, 1988) can be used so that the vertices are exchanged and moved in consideration of the results of the three evaluation steps 22 through 24.

Figure 9:
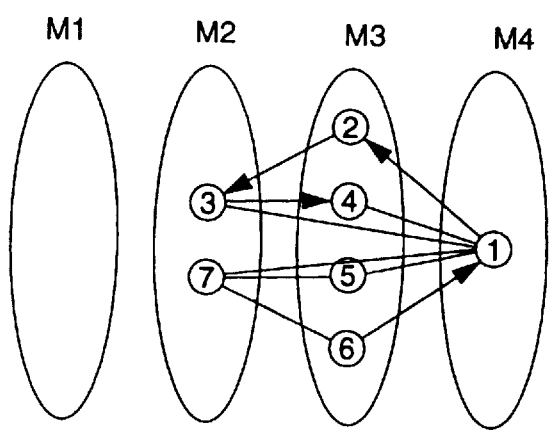
FIG. 9 is a diagram for showing the final result obtained by executing a clustering step in the multilayer routing method.

Next, in the topology generation step 13, the final clusters shown in FIG. 9 are converted into routing patterns. In this conversion, a routing pattern is generated with regard to each cluster (layer). Furthermore, the routing patterns are set so as to include wires and stacked vias having actual dimensions. Additionally, when a cluster has any directed edge, the routing patterns are determined in consideration of the directed edge, namely, in consideration of the vertical positional relationship among the vertices included in the cluster.

Figure 10A:
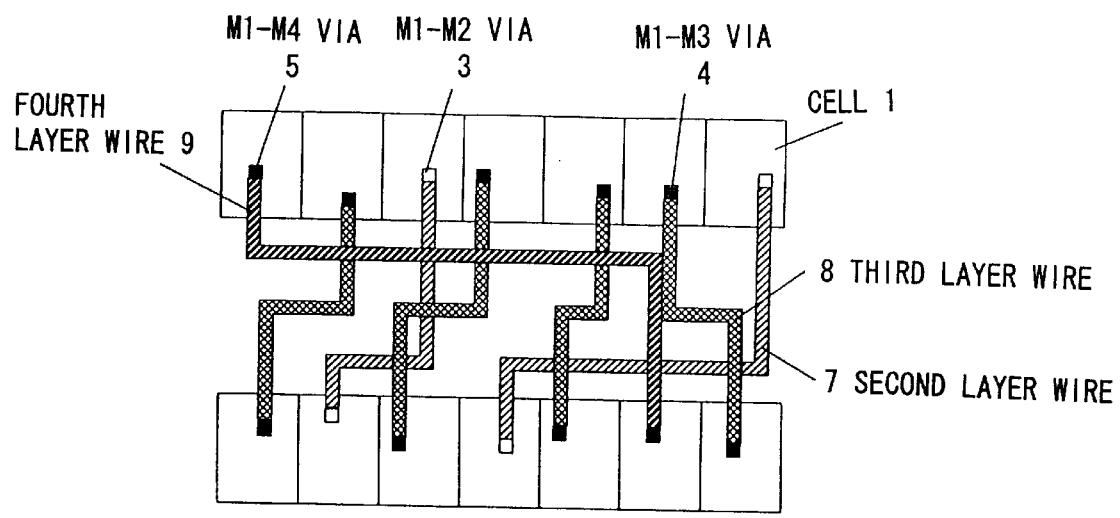
FIG. 10(a) is a diagram for showing the final result obtained by executing a topology generation step in the multilayer routing method.

In this embodiment, as a result of executing the topology generation step 13 based on the routing requirements shown in FIG. 5(a) and the final clusters shown in FIG. 9, the routing patterns shown in FIG. 10(a) are generated.

In the routing patterns of FIG. 10(a), stacked vias, that is, an M1–M2 via 3, an M1–M3 via 4 and an M1–M4 via 5, are disposed in positions corresponding to the terminals 2 of the respective cells 1. Therefore, similarly to the first embodiment, wires 7 through 9 on the respective layers are prevented from being bent, resulting in a minimized area of each channel. The vias 3 through 5 can be disposed in positions adjacent to the terminals 2 similarly to the first embodiment.

Finally, in the channel compaction step 14, each channel is compacted (compressed) with the design rule satisfied. In this embodiment, since the size of each cell 1 in the horizontal direction is already determined, the vertical dimension alone is compacted. In this channel compaction step 14, any of compaction methods can be adopted such as a nutcracker method ("Nutcracker", 24th Design Automation Conf., pp. 298–304, 1987) and a channel spacer method.

Figure 10B:
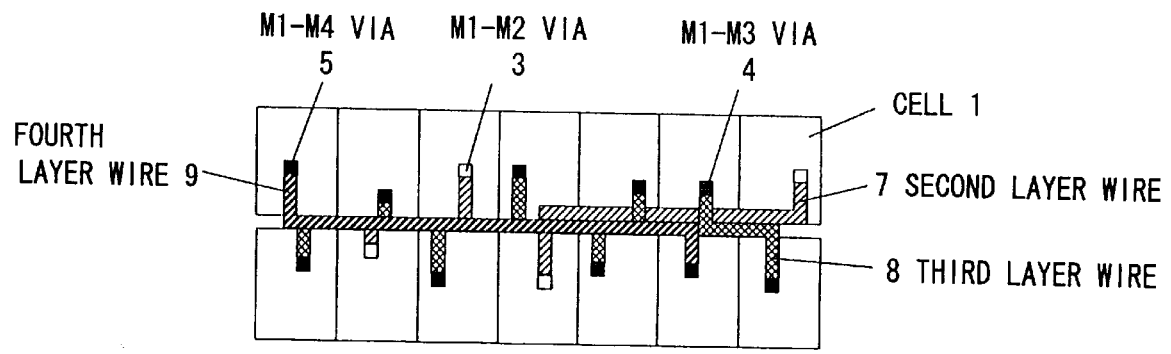
FIG. 10(b) is a diagram for showing the final result obtained by executing a channel compaction step in the multilayer routing method.

In this embodiment, the execution of the channel compaction step 14 on the routing patterns shown in FIG. 10(a) results in routing patterns shown in FIG. 10(b). As is understood from FIG. 10(b), the resultant routing patterns attain a high density.

In the final clusters obtained by the clustering shown in FIG. 9, the cluster M2 of the second layer includes two vertices (nets), the cluster M3 of the third layer includes four vertices, and the cluster M4 of the fourth layer includes one vertex. In an actual semiconductor integrated circuit, the number of the nets is extremely large, and hence, the numbers of the vertices (nets) assigned to the clusters of the respective layers are substantially equal to one another. As a result, the ratios of the numbers of stacked vias extending to the respective layers to the total number of the stacked vias are substantially equal.

Figure 12A:
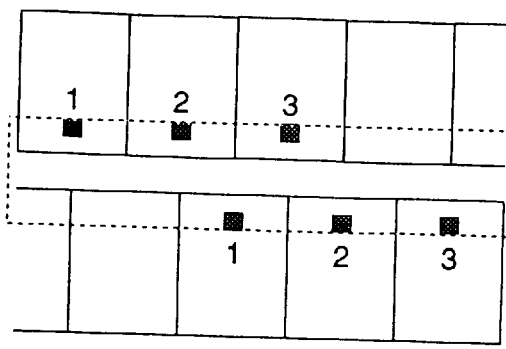
FIG. 12(a) is a diagram of channels generated in the multilayer routing method of the invention.
Figure 12B:
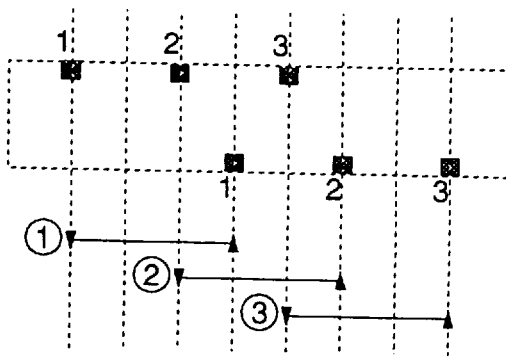
FIG. 12(b) is a diagram of segment representation of nets generated in the multilayer routing method.
Figure 12C:
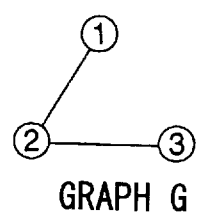
FIG. 12(c) is a diagram showing a constraint graph generated in the multilayer routing method.

Now, description will be made to show that the clustering of this embodiment is effective in decreasing the channel height. FIG. 12(a) shows a channel defined in the channel generation step, FIG. 12(b) shows segment representation of nets 1, 2 and 3 by the constraint graph generation step 11, and FIG. 12(c) shows a constraint graph generated based on the segment representation of the nets of FIG. 12(b).

Figure 13A:
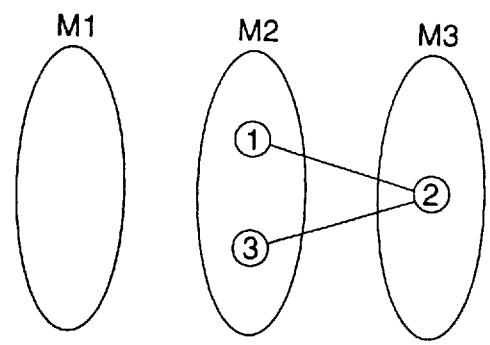
FIG. 13(a) is a diagram for showing the result of clustering in the multilayer routing method.
Figure 13B:
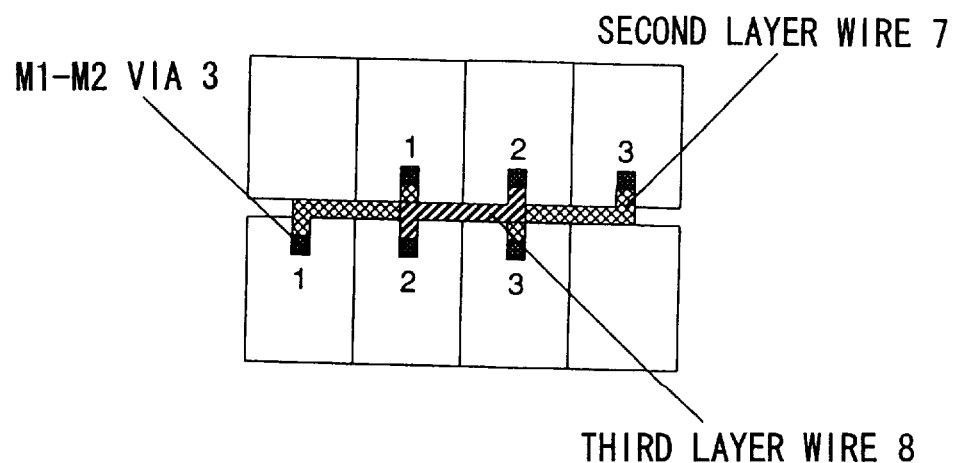
FIG. 13(b) is a diagram for showing the final routing result by the multilayer routing method.

On the assumption that the number of available layers is three, when the clustering step 13 is executed on the three layers, clusters shown in FIG. 13(a) are obtained, and routing patterns of FIG. 13(b) are obtained as the final routing patterns. As is obvious from FIGS. 13(a) and 13(b), the number of the edges in each cluster is "0", and hence, the second and third layers are effectively used so as to minimize the channel height.

Figure 14A:
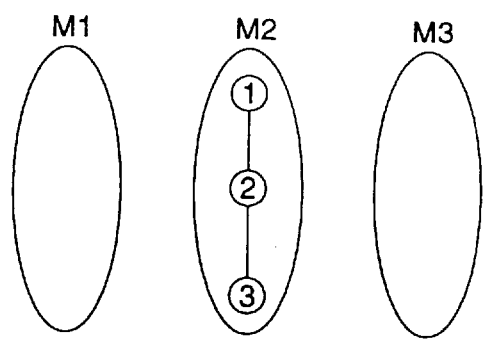
FIG. 14(a) is a diagram of clusters obtained when the clustering step of the present multilayer routing method is not adopted.
Figure 14B:
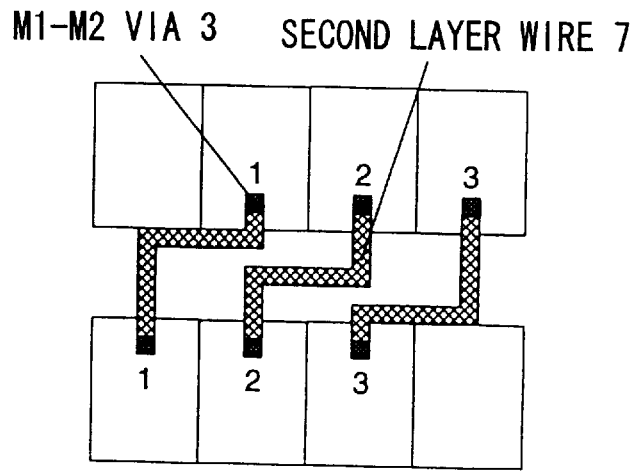
FIG. 14(b) is a diagram for showing the final routing result obtained when the clustering step of the present multilayer routing method is not adopted.

In contrast, when the routing problem of FIG. 12(a) is solved by using only two layers, the clusters shown in FIG. 14(a) are obtained. In FIG. 14(a), the cluster M2 of the second layer includes two undirected edges. However, when the relative positional relationship between the horizontal wires (trunks) is appropriately set as shown in FIG. 14(b), the nets can be interconnected without providing a via. The channel height is, however, disadvantageously large as compared with the channel height shown in FIG. 13(b) according to this embodiment. Therefore, in the conventional routing shown in FIG. 14(b), even when the number of the vias is minimized, the channel height cannot be minimized. For the compactness of a semiconductor integrated circuit, the channel height is required to be minimized. From this point of view, according to this embodiment, the number of vias can be minimized while also minimizing the channel height, and therefore, the resultant semiconductor integrated circuit can be effectively made compact.

(Embodiment 3)

Now, a multilayer routing method for executing the routing requirements of FIG. 5(a) by using three layers will be described referring to FIGS. 15(a) through 15(c), 16(a) and 16(b).

Figure 15A:
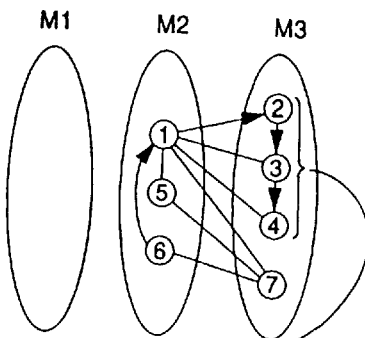
FIG. 15(a) is a diagram for showing the result of clustering in a multilayer routing method for a semiconductor integrated circuit of a third embodiment of the invention.
Figure 15B:
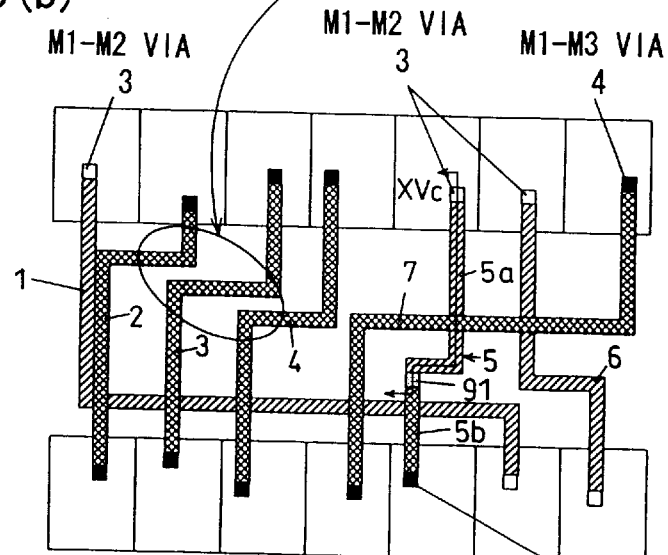
FIG. 15(b) is a diagram for showing the topological routing result in the multilayer routing method.
Figure 15C:
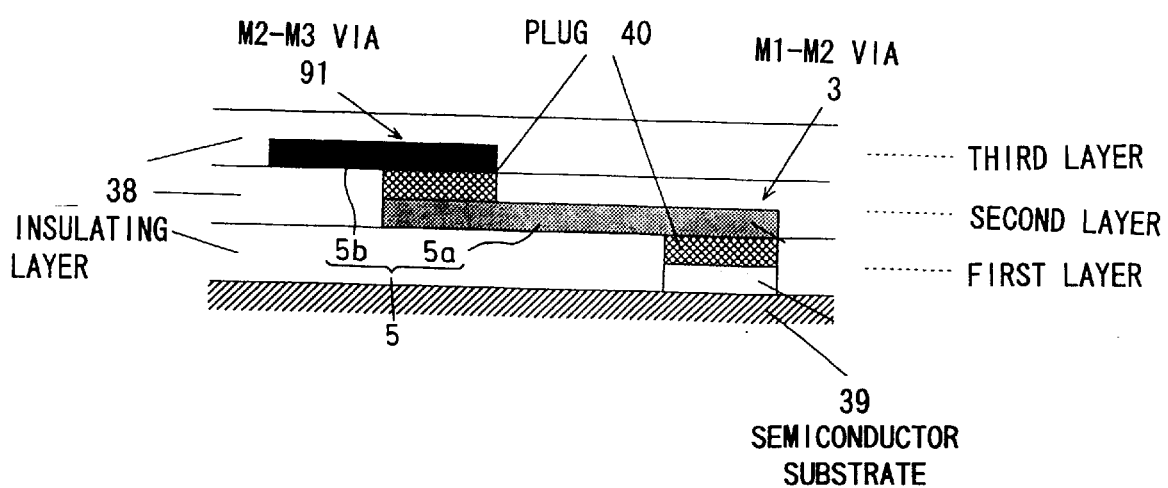
FIG. 15(c) is a sectional view of a main part of the topological routing result by the multilayer routing method.

FIG. 15(a) shows final clusters obtained by the clustering step 12. FIGS. 15(b) and 15(c) show the result of executing the topology generation step 13 in the aforementioned manner on the final clusters of FIG. 15(a). In the final clusters shown in FIG. 15(a), one undirected edge is present between vertices 1 and 5 in a cluster M2 of the second layer. Owing to the presence of the undirected edge, the interconnection of the vertex (net) 1 consists of a second layer wire in FIGS. 15(b) and 15(c), and the interconnection of the vertex (net) 5 consists of a second layer wire 5a, a third layer wire 5b and an M2–M3 via 91 for connecting these wires as is shown in FIG. 15(c). Furthermore, three directed edges are present in a cluster M3 of the third layer shown in FIG. 15(a). However, the trunks of the nets are disposed in the order of the arrows shown in FIG. 15(a), namely, in the order of the vertex 2, the vertex 3 and the vertex 4 (see a portion surrounded by an ellipse in FIG. 15(b)), and hence there is no need to provide a stacked via.

The result of the channel compaction step 14 on these routing patterns is shown in FIGS. 16(a) and 16(b). Similarly to FIG. 2, stacked vias 3, 4 and 5 are disposed in the same positions as the terminals.

(Embodiment 4)

Next, the fourth embodiment of the invention will be described referring to FIGS. 17 through 20.

Figure 17:
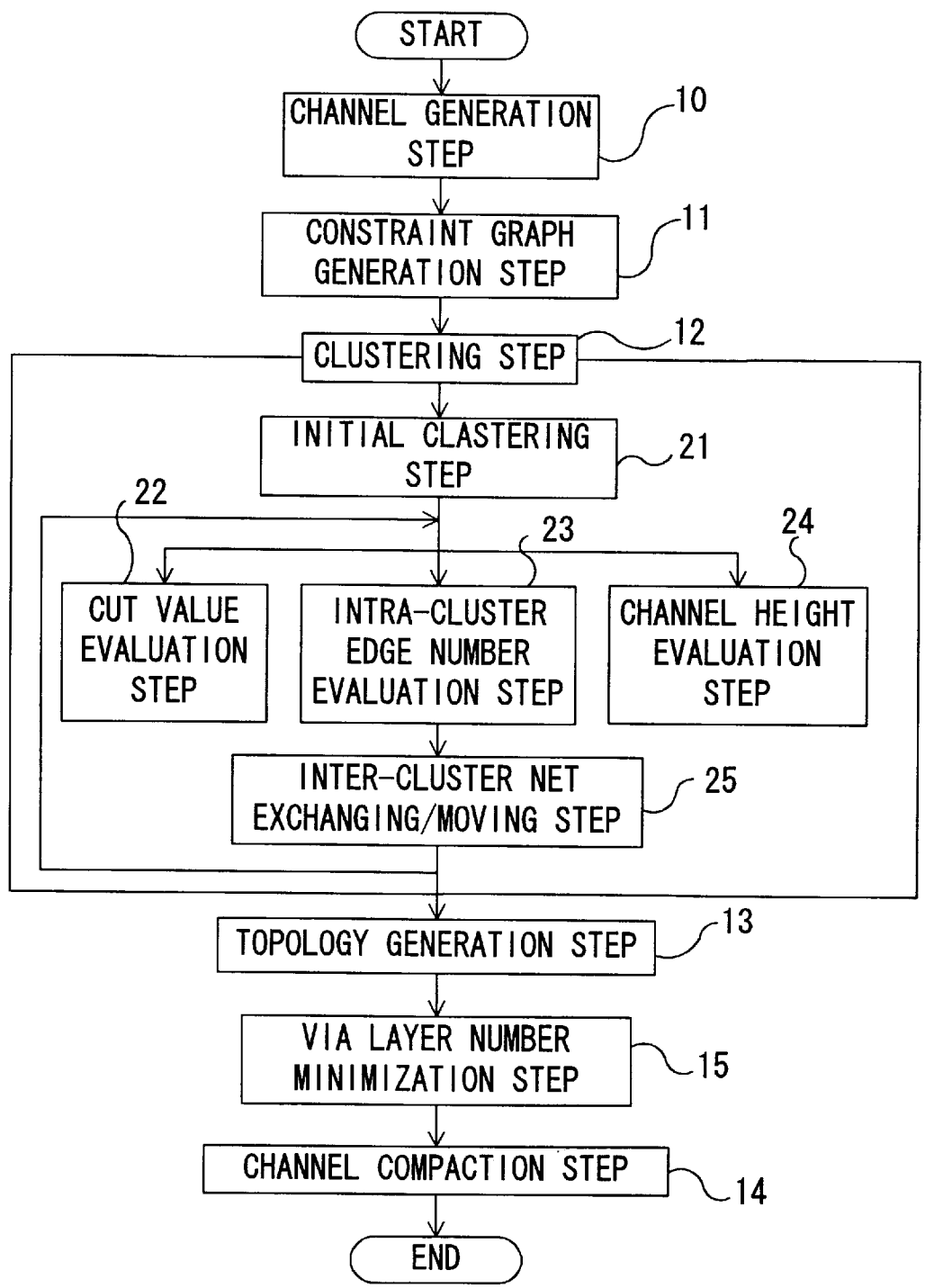
FIG. 17 is a flow chart for a multilayer routing method for a semiconductor integrated circuit of a fourth embodiment of the invention.

FIG. 17 is a flow chart for a multilayer routing method of this embodiment, which is different from the multilayer routing method of the second embodiment shown in FIG. 4 in the addition of a via layer number minimization step after the topology generation step 13. A via layer number herein means the number of layers from an arbitrary layer to another layer, and for example, an M1–M3 via has a via layer number of two.

Figure 18:
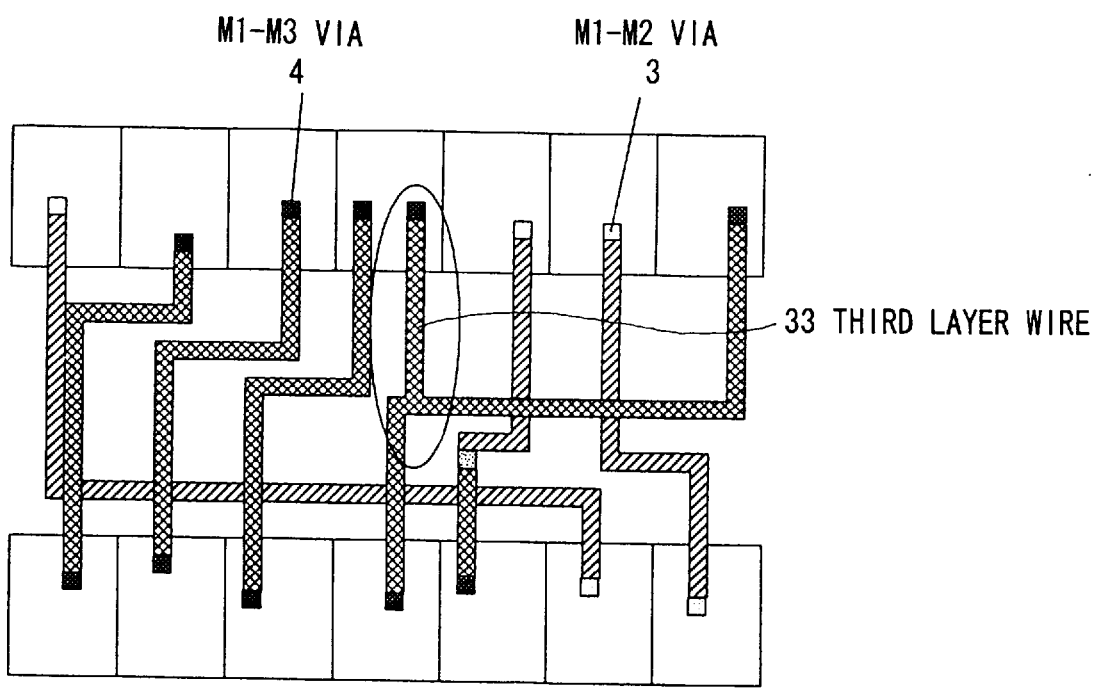
FIG. 18 is a diagram for showing the topological routing result in the multilayer routing method.

FIG. 18 shows an example of the result of the topology generation step 13. In FIG. 18, a portion surrounded by an ellipse is added to the result of the topology generation step 13 of the third embodiment shown in FIG. 15(b) so as to be more easily understood.

Figure 19:
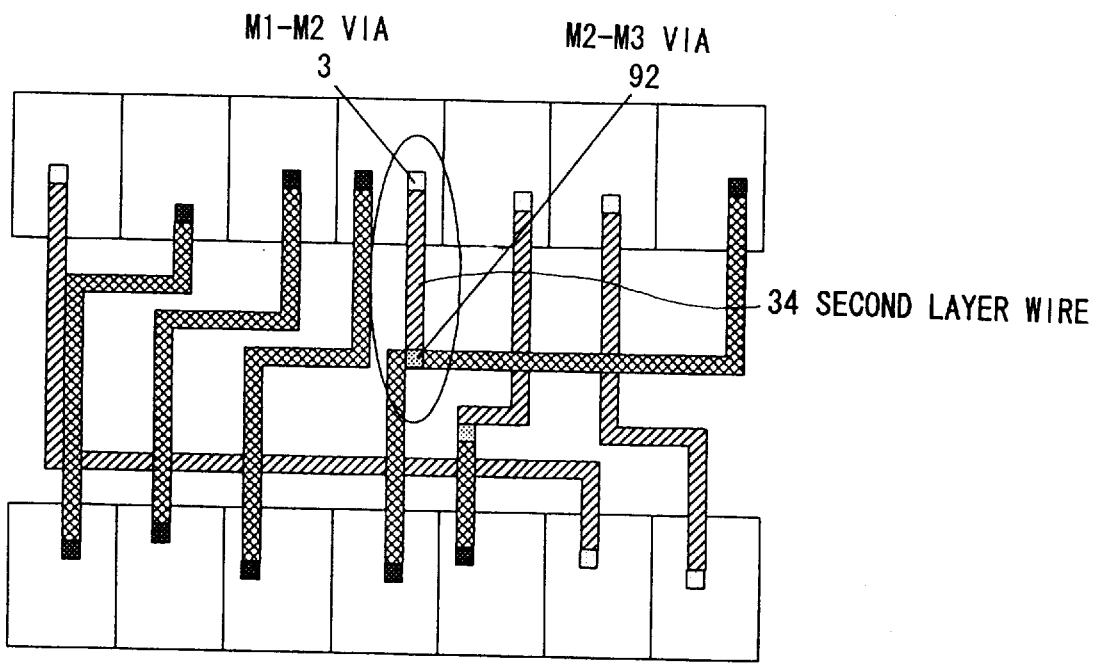
FIG. 19 is a diagram for showing the result obtained by executing a via layer number minimization step on the topological routing result of FIG. 18.

FIG. 19 shows the result of the via layer number minimization step 15 executed on the routing result shown in FIG. 18. In FIG. 19, an M2–M3 via 92 is added in the portion surrounded by the ellipse, and a third layer 33 and an M1–M3 via 4 of FIG. 18 are replaced with a second layer 34 and an M1–M2 via 3.

Accordingly, in this embodiment, the stacked via (M1–M3 via 4) disposed in the same position as the terminal is replaced with the M1–M2 via 3, so as to decrease the via layer number. The number of plugs 40 is accordingly decreased, resulting in improving the reliability of the stacked via and increasing the yield in the production of semiconductor LSIs.

Figure 20:
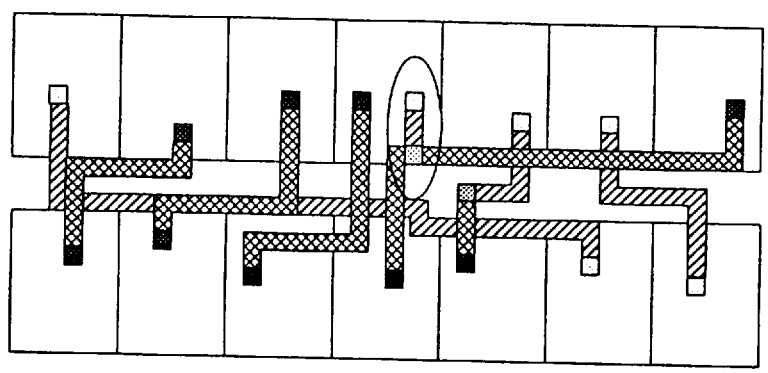
FIG. 20 is a diagram for showing the final routing result by the multilayer routing method.
Figure 21:
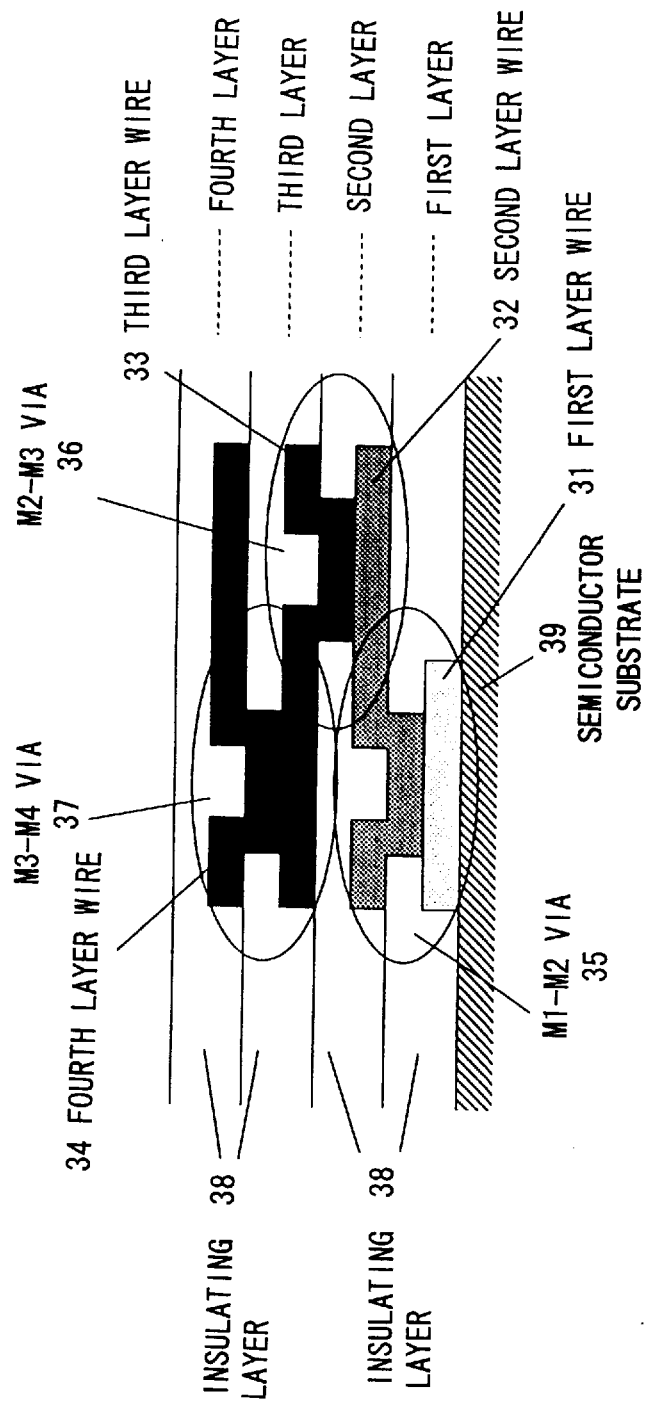
FIG. 21 is a sectional view for showing the structure of a conventional via.

FIG. 20 shows the final routing patterns obtained by executing the channel compaction step 14. As is obvious from the comparison between the routing patterns of FIG. 20 and the final routing patterns of the third embodiment shown in FIG. 16(a), the channel is not enlarged due to the generation of the M2–M3 via 92.

What is claimed is:

1. A multilayer routing structure of a semiconductor integrated circuit comprising:

plural functional blocks or cells each having at least one terminal; and wires for interconnecting the plural functional blocks or cells with one another at the terminals by using multiple layers in accordance with logical connection requirements, wherein a plurality of stacked vias are formed and each of the stacked vias is disposed in a position the same as or adjacent to the terminal of each functional block or cell, so as to connect the terminal at the same potential with a wire on a specific layer different from a layer on which the terminal is disposed.

2. The multilayer routing structure of a semiconductor integrated circuit of claim 1, wherein the terminal of the functional blocks or cells is disposed on a lowermost layer, and a plurality of the stacked vias extend to one layer among the multiple layers excluding the lowermost layer, so that ratios of numbers of stacked vias extending to respective layers to a total number of the stacked vias are substantially equal.

3. A multilayer routing method for a semiconductor integrated circuit in which plural functional blocks or cells each having at least one terminal are allocated and the allocated functional blocks or cells are interconnected with one another at the terminals by using a number of layers in accordance with logical connection requirements, comprising:

a channel generation step of defining a channel for routing plural nets for interconnecting the terminals with one another;

a constraint graph generation step of generating a constraint graph by representing constraint in horizontal and vertical directions among the plural nets in the defined channel by using edges and also representing the plural nets by using vertices;

a clustering step of obtaining clusters with regard to the respective layers by assigning the vertices of the constraint graph to the number of layers so as to minimize a number of vias in consideration of a height of the defined channel;

a topology generation step of generating routing topology on the basis of the clusters of the respective layers and the constraint graph; and a channel compaction step of generating routing patterns satisfying a design rule on the basis of the routing topology.

4. The multilayer routing method for a semiconductor integrated circuit of claim 3, wherein, in the channel generation step, a channel is defined as a rectangular or rectilinear area including a plurality of terminals included in adjacent two cell arrays in each of which plural functional blocks or cells are aligned.

5. The multilayer routing method for a semiconductor integrated circuit of claim 3, wherein, in the constraint graph generation step, the constraint in the horizontal direction among the plural nets is represented by using an undirected edge and the constraint in the vertical direction among the plural nets is represented by using a directed edge, and when both the undirected edge and the directed edge are present between arbitrary two nets, the undirected edge is eliminated, so as to generate a constraint graph consisting of a remaining undirected edge, a directed edge and vertices.

6. The multilayer routing method for a semiconductor integrated circuit of claim 3, wherein the clustering step includes:

an initial clustering step of initially assigning the plural nets to the number of layers on the basis of the constraint graph;

a cut value evaluation step of calculating a cut value which is a number of edges of the constraint graph between adjacent clusters among clusters obtained with regard to the respective layers in the initial clustering step;

an intra-cluster edge number evaluation step of calculating a number of the edges of the constraint graph in each of the clusters of the respective layers obtained in the initial clustering step;

a channel height evaluation step of calculating a needed channel height in each of the clusters of the respective layers obtained in the initial clustering step on the basis of the number of the edges of the constraint graph obtained in the intra-cluster edge number evaluation step; and an inter-cluster net moving/exchanging step comprising at least one of the step of moving or, the step of exchanging, the nets among the clusters of the respectively layers obtained in the initial clustering step on the basis of the cut value, the number of the edges of the constraint graph in each of the clusters and the channel height obtained in the three evaluation steps, so as to minimize the cut value, the number of the edges in each of the clusters and the channel height.

7. The multilayer routing method for a semiconductor integrated circuit of claim 6, wherein, the initial clustering step, procedures of allowing an arbitrary vertex to belong to a set, allowing another vertex having no edge commonly with the vertex belonging to the set to belong to the set, and further allowing still another vertex having no edge commonly with any of the vertices belonging to the set to belong to the set are repeated;

when there remains no vertex which has no edge commonly with any of the vertices belonging to the set, all the vertices belonging to the set are assigned to an arbitrary cluster, and the aforementioned procedures are repeatedly conducted on remaining vertices.

8. The multilayer routing method for a semiconductor integrated circuit of claim 6, wherein, in the channel height evaluation step, the needed channel height is calculated on the basis of a spacing between a terminal and a wire, a width of a wire, the number of edges of the constraint graph in each cluster, and a spacing between two wires.

9. The multilayer routing method for a semiconductor integrated circuit of claim 6, wherein, in the inter-cluster net moving/exchanging step, an operation is conducted on all the vertices, the operation being such that when the cut value obtained in the cut value evaluation step is decreased by exchanging a vertex included in any of the clusters with another vertex included in another cluster, the vertices are exchanged with each other, and an operation is then conducted on all the vertices, the operation being such that when a total number of the edges in two clusters is decreased by moving a vertex included one cluster to the other cluster, the vertex is moved to the latter cluster.

10. The multilayer routing method for a semiconductor integrated circuit of claim 3, further comprising, when the routing topology generated in the topology generation step includes a stacked via, after the topology generation step, a via layer number minimization step of minimizing a via layer number, which is a number of layers penetrated by the stacked via.

* * * * *